(12) United States Patent
Ahn et al.

(10) Patent No.: US 6,602,038 B2
(45) Date of Patent: Aug. 5, 2003

(54) UNIFIED CONVEYING APPARATUS, AND SEMICONDUCTOR DEVICE MANUFACTURING FACILITY COMPRISING THE SAME

(75) Inventors: Seung-Hoon Ahn, Yongin-si (KR); Seok-Hee Park, Yongin-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 44 days.

(21) Appl. No.: 09/995,875

(22) Filed: Nov. 29, 2001

(65) Prior Publication Data

US 2002/0064442 A1 May 30, 2002

(30) Foreign Application Priority Data

Nov. 30, 2000 (KR) ........................................ 2000-71791

(51) Int. Cl.[7] ................................................. B65G 1/00
(52) U.S. Cl. ...................... 414/279; 414/591; 104/118; 104/119; 105/141; 105/150; 198/465.2; 198/465.4
(58) Field of Search ................................ 414/279, 591; 198/465.2, 465.4; 104/118, 119, 93; 105/141, 150

(56) References Cited

U.S. PATENT DOCUMENTS

| 3,111,910 | A | * | 11/1963 | Pao | 104/120 |
|---|---|---|---|---|---|
| 3,760,737 | A | * | 9/1973 | Becker et al. | 104/89 |
| 3,880,299 | A | * | 4/1975 | Zollinger et al. | 414/273 |
| 3,882,786 | A | * | 5/1975 | Woligrocki | 104/89 |
| 4,423,685 | A | * | 1/1984 | Kerckhoff | 105/150 |
| 4,624,617 | A | | 11/1986 | Belna | |
| 4,825,111 | A | * | 4/1989 | Hommes et al. | 310/12 |
| 5,078,254 | A | * | 1/1992 | Colonius et al. | 198/345.3 |
| 5,333,982 | A | * | 8/1994 | Tanizawa et al. | 414/279 |
| 5,417,537 | A | | 5/1995 | Miller | |

* cited by examiner

*Primary Examiner*—Joe Dillon, Jr.
(74) *Attorney, Agent, or Firm*—Volentine Francos, PLLC (57) ABSTRACT

A conveying apparatus conveys articles used for manufacturing semiconductor devices. The conveying apparatus has a conveying rail section that includes a first rail providing a first conveying route, a second rail providing a second conveying route, and an intermediate rail structure interconnecting the first and second rails. Respective vehicles are fitted to the first and second rails so as to convey articles as supported atop the first rail or as suspended from the second rail, respectively. The conveying apparatus can be readily installed in the bay of an automatic manufacturing system, e.g., of a type for processing wafers having a diameter of 300 mm. In this case, the conveying route of the articles is unified, and space is saved, as well.

8 Claims, 6 Drawing Sheets

UNIFIED CONVEYING APPARATUS, AND SEMICONDUCTOR DEVICE MANUFACTURING FACILITY COMPRISING THE SAME

BACKGROUND OF THE INVENTION

1. Field of the Invention

The present invention relates to a conveying apparatus of a semiconductor device manufacturing system. More particularly, the present invention relates to a conveying apparatus having a rail section that connects semiconductor manufacturing apparatus and provides a conveying route for transferring articles used for manufacturing the semiconductor devices.

2. Description of the Related Art

With the current widespread usage of computers in information media, semiconductor memory devices are being rapidly developed to provide semiconductor devices having a high memory storage capacity and operating speed. To this end, current semiconductor technology is focused on developing and realizing memory devices having a high degree of integration, response speed, and reliability.

Semiconductor devices are manufactured by sequentially carrying out several processes including a film-forming process, a pattern-forming process, and a metal line-forming process. In carrying out these processes, articles including a wafer and a carrier for supporting the wafer are frequently conveyed in a semiconductor manufacturing system. Accordingly, a conveying apparatus for conveying these articles has been developed.

In the early stages of the semiconductor manufacturing industry, a conveying apparatus was implemented for conveying articles between semiconductor manufacturing apparatus that performed the manufacturing processes in sequence. Then, as the semiconductor manufacturing industry became more advanced, an automatic manufacturing facility was developed for manufacturing the semiconductor devices. The automatic manufacturing system was configured in a bay, including several intrabays in which the processing apparatus were laid out and an interbay that ran between the intrabays. Accordingly, a conveying apparatus was developed for use with this layout of an automatic manufacturing system. More specifically, a conveying apparatus comprising an auto guided vehicle (AGV) was developed to convey the articles throughout the automatic manufacturing system.

Recently, an over-head transfer (OHP) apparatus has been used to convey the articles along with an auto guided vehicle in an automatic manufacturing system. The over-head apparatus is mainly used to convey wafers having a diameter of 300 mm. The over-head transfer apparatus includes a series of rails installed on the ceiling of the bay and a vehicle running along the rails.

Examples of conveying apparatus that are composed of rails and a vehicle adapted to travel therealong are disclosed in U.S. Pat. No. 4,624,617 (issued to Belna), U.S. Pat. No. 5,417,537 (issued to Miller), and Korean Patent laid-open publication No. 88-10483.

An over-head transfer apparatus can be classified as an over head hoist type or an over head shuttle type according to the position in which the articles are conveyed. The over-head hoist type of conveying apparatus transfers the articles while the articles are hanging downwardly from the rails and is mainly used in the intrabay. The over-head shuttle type of conveying apparatus transfers the articles while the articles are supported upwardly on the rails and is mainly used in the interbay.

The vehicle of either type of over-head transfer apparatus runs along the rails as driven by a reusable battery or a magnetic levitated force. Since a vehicle driven by a magnetic levitated force does not generate particles, it is widely used in semiconductor manufacturing facilities. As an example, U.S. Pat. No. 4,624,617 discloses a conveying apparatus in which a magnet is installed on rails, and a vehicle is levitated by the magnet.

The wafers used in the semiconductor manufacturing industry have increased in size, from those having a diameter of 200 mm to those having a diameter of 300 mm. Accordingly, an over-head transfer apparatus has been designed for use in a bay of an automatic manufacturing system for processing wafers having a diameter of 300 mm. In this case, an over-head hoist type of conveying apparatus is installed in the intrabay and an overhead shuttle type of conveying apparatus is installed in the interbay.

Nonetheless, the routing of the over-head hoist type of conveying apparatus and the over-head shuttle type of conveying apparatus can overlap. Because the over-head hoist type of conveying apparatus conveys the articles while the articles are hanging downwardly and the overhead shuttle type of conveying apparatus conveys the articles the articles are facing upwardly, a serious problem is created when the installation routes of the conveying apparatus are duplicated.

If the installation routes are duplicated, the over-head hoist type of conveying apparatus and the over-head shuttle type-of conveying apparatus must be installed at different positions within essentially the same space. For this reason, the conveying route must be expanded and the space required to separately accommodate both the over-head hoist type of conveying apparatus and the over-head shuttle type of conveying apparatus is rather large.

Accordingly, using both an over-head hoist type of conveying apparatus and an over-head shuttle type of conveying apparatus gives rise to significant installation problems and space requirements. In addition, the use of both an over-head hoist type of conveying apparatus and an over-head shuttle type of conveying apparatus reduces the operating efficiency of the automatic manufacturing system.

SUMMARY OF THE INVENTION

The present invention has been developed to solve the above-described problems of the prior art and accordingly, it is an object of the present invention to provide a conveying apparatus for use in an automated semiconductor device manufacturing system, which unifies the routes along which articles are conveyed.

Another object of the present invention is to provide a conveying apparatus that can be easily installed in a bay of an automatic manufacturing system.

Another object of the present invention is to provide a conveying apparatus that can convey articles in various manners in a bay of an automatic manufacturing without occupying a large amount of space in the bay.

To achieve these objects, the present invention provides a conveying apparatus comprising a conveying rail section including a first rail providing a first conveying route along which upwardly facing articles used for manufacturing semiconductor devices can be conveyed, a second rail providing a second conveying route along which downwardly hanging articles can be conveyed, and intermediate rail structure by which the first and second rails are integrated.

The conveying apparatus also comprises at least one over-head shuttle type of transfer vehicle that runs along the first rail of the conveying rail section, and an over-head hoist type of transfer vehicle that runs along the second rail of the conveying rail section.

The conveying rail section includes a first rail section, that may be disposed adjacent a plurality of the processing apparatuses of the semiconductor device manufacturing system, a second rail section juxtaposed with the first rail section, and cross rails connecting ends of the first rail section to ends of the second rail section, such that a continuous loop for circulating the vehicles is formed.

The first rail of the conveying rail section is disposed at the top of the conveying rail section and extends horizontally, parallel to the ground when installed, and the second rail is disposed at the bottom of the conveying rail section and extends parallel to the first rail. The first and second rails are connected to each other by an intermediate rail structure in the form of a beam that is oriented vertically between the centers of the bottom surfaces of the first and second rails.

The first vehicle includes a first support for the articles and a first running portion that runs along the first rail. The first running portion extends from both sides of the bottom of the first support to both sides of the bottom surface of the first rail and is in surface-contact with the intermediate rail structure of the conveying rail section. The second vehicle includes a second support from which articles can hang and a second running portion that runs along the second rail. The second rail extends from both sides of the top of the second support to both sides of the bottom (upwardly facing) surface of the second rail and is in surface-contact with the intermediate rail structure of the conveying rail section.

The first support includes a plate and a wall that projects from the periphery of the plate to prevent articles from falling off of the plate while the articles are being conveyed. The second-support includes a flange configured to receive a member by which articles can be suspended from the flange. Both vehicles have guide wheels for guiding the vehicles along the respective rails.

At least one vehicle of the vehicle section may be a magnetically levitated (mag-lev) vehicle. For example, a plurality of magnets for generating a magnetic levitating force may be provided at an upper portion of the conveying rail section in a line parallel to the ground. A third vehicle operated by the magnetic levitating force is provided on the conveying rail section.

The conveying apparatus includes the first rail, the first vehicle running along the first rail, the second rail integrated with the first rail, and the second vehicle running along the second rail, to unify the conveying routes in the bay. The conveying apparatus can be installed in the bay without occupying a large amount of space. Accordingly, an automatic manufacturing system for processing wafers having a diameter of 300 mm can be effectively achieved.

BRIEF DESCRIPTION OF THE DRAWINGS

The above and other objects, features and advantages of the present invention will become more apparent from the following detailed description of the preferred embodiments thereof made with reference to the attached drawings, of which.

DETAILED DESCRIPTION OF THE PREFERRED EMBODIMENTS

Hereinafter, the present invention will be described in detail with reference to the accompanying drawings.

Figure 1:
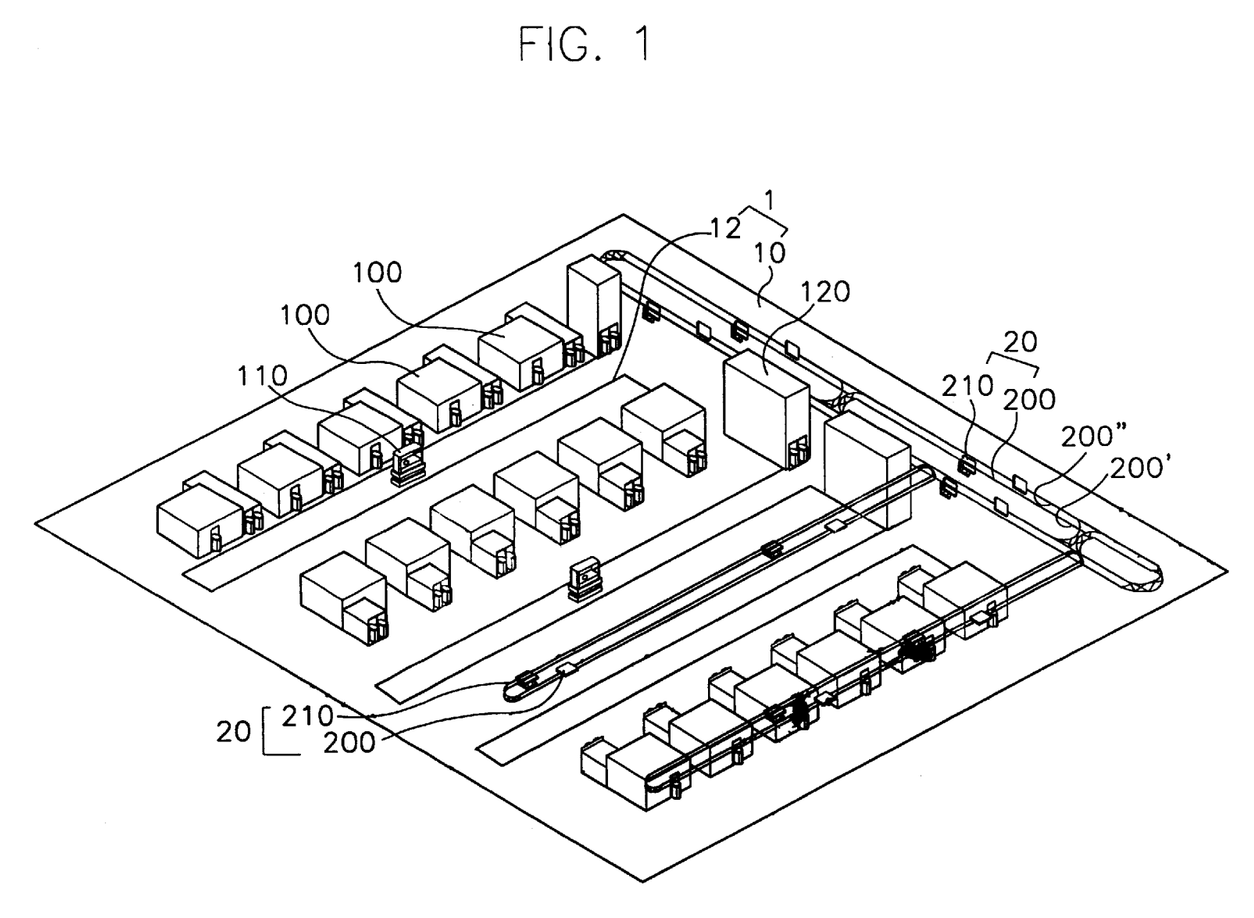
FIG. 1 is a perspective view of an automatic manufacturing facility for fabricating semiconductor devices, including an integrated conveying apparatus, according to the present invention.

FIG. 1 shows a facility for manufacturing semiconductor devices according to the present invention. Referring to FIG. 1, the bay 1 in which the facility is laid out includes intrabays 12 and an interbay 10. A photolithography process, in which light irradiates a predetermined portion of a photoresist layer formed on a wafer, is carried out in the bay 1. Accordingly, a plurality of processing apparatus in the form of steppers 100 provided with a reticle and an optical lens system, are installed in the intrabays 12. The photolithography process requires different reticles according to the stage of the process. Hence, reticles are frequently conveyed in the bay 1 so that the processing apparatuses can be adapted for use in the particular stage of the overall process. Therefore, articles conveyed throughout the bay 1 include the reticles and wafers. When the wafers are conveyed in the bay 1, a plurality of wafers are loaded in a carrier and the carrier is conveyed. If the wafers to be conveyed have diameters of 300 mm, the wafers are loaded in a front opening unified pod (FOUP) and the front opening unified pod is conveyed.

Each intrabay 12 includes sufficient space for an auto guide vehicle 110 to move in the intrabay 12. Accordingly, the photolithography process using the steppers 100 and the conveying of reticles and wafers using the auto guide vehicle 110 are carried out in the intrabay 12.

As mentioned above, the interbay 10 connects the intrabays 12 to each other. In this way, articles may be conveyed by a conveying apparatus 20 from the interbay 10 to an intrabay 12, or from each intrabay 12 to the interbay 10. In addition, stockers 120 for automatically storing the articles are installed in areas at which the intrabays 12 and the interbay 10 are connected to each other. Therefore, the articles are conveyed from the intrabays 12 to the interbay 10, or vice versa, through the stockers 120.

That is, in the manufacturing facility according to the present invention, articles are conveyed by means of the auto guided vehicle(s) 110 and the conveying apparatuses 20. Specifically, the conveying of articles in an intrabay 12 is carried out by means of the auto guided vehicle 110 and a conveying apparatus 20, but the conveying of articles in the interbay 10 is exclusively carried out by a conveying apparatus 20.

Hereinafter, the structure of a conveying apparatus 20 will be described in detail.

The conveying apparatus 20 includes a conveying rail section 200 and a vehicle section 210. The conveying rail section 200 installed in an intrabay 12 connects the steppers 100 to each other and the conveying rail section 200 installed at the interbay 10 connects the stockers 120 to each other.

Figure 2:
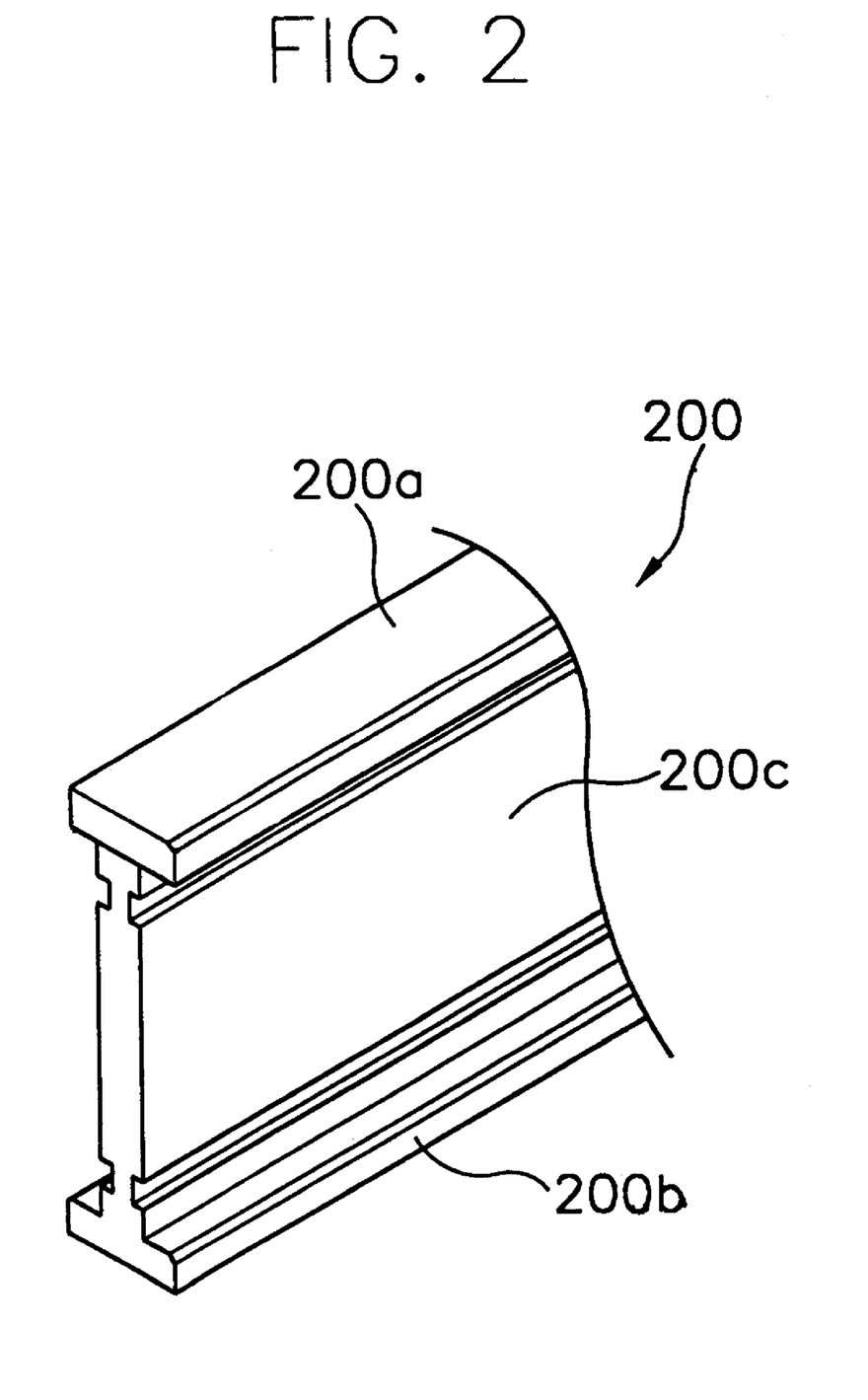
FIG. 2 is a perspective view of a conveying rail of the conveying apparatus shown in FIG. 1.

The structure of the conveying rail section 200 will now be described with reference to FIG. 2. The conveying rail section 200 includes a first rail 200a that provides a first conveying route through which the upwardly loaded articles are conveyed, and a second rail 200b that provides a second conveying route through which the downwardly hanging articles are conveyed. The first and second rails 200a and 200b are integral with one another.

The first rail 200a is disposed at the top of the conveying rail section 200 and the second rail 200b is disposed at the bottom of the conveying rail section 200 in parallel to the first rail 200a. The first rail, 200a and the second rail 200b also extend parallel to the ground. A rail support structure, such as vertical beam 200c, interconnects the first and second rails 200a and 200b. More specifically, the vertical beam 200c extends to and between transverse centers of the bottom surfaces of the first and second rails 200a and 200b, so the conveying rail section 200 has an "I" shape.

The conveying rail sections 200 constitute circulation rails which circulate articles between the steppers 100 or between the stockers 120, respectively. The conveying rail section 200 installed in the interbay 10, for instance, includes a first rail section 200☐ and a second rail section 200" adjacent to the first circulation rail section (FIG. 1). Ends of these first 200' and second 200" rail sections are connected so that the overall conveying rail section 200 is a continuous loop.

Figure 3:
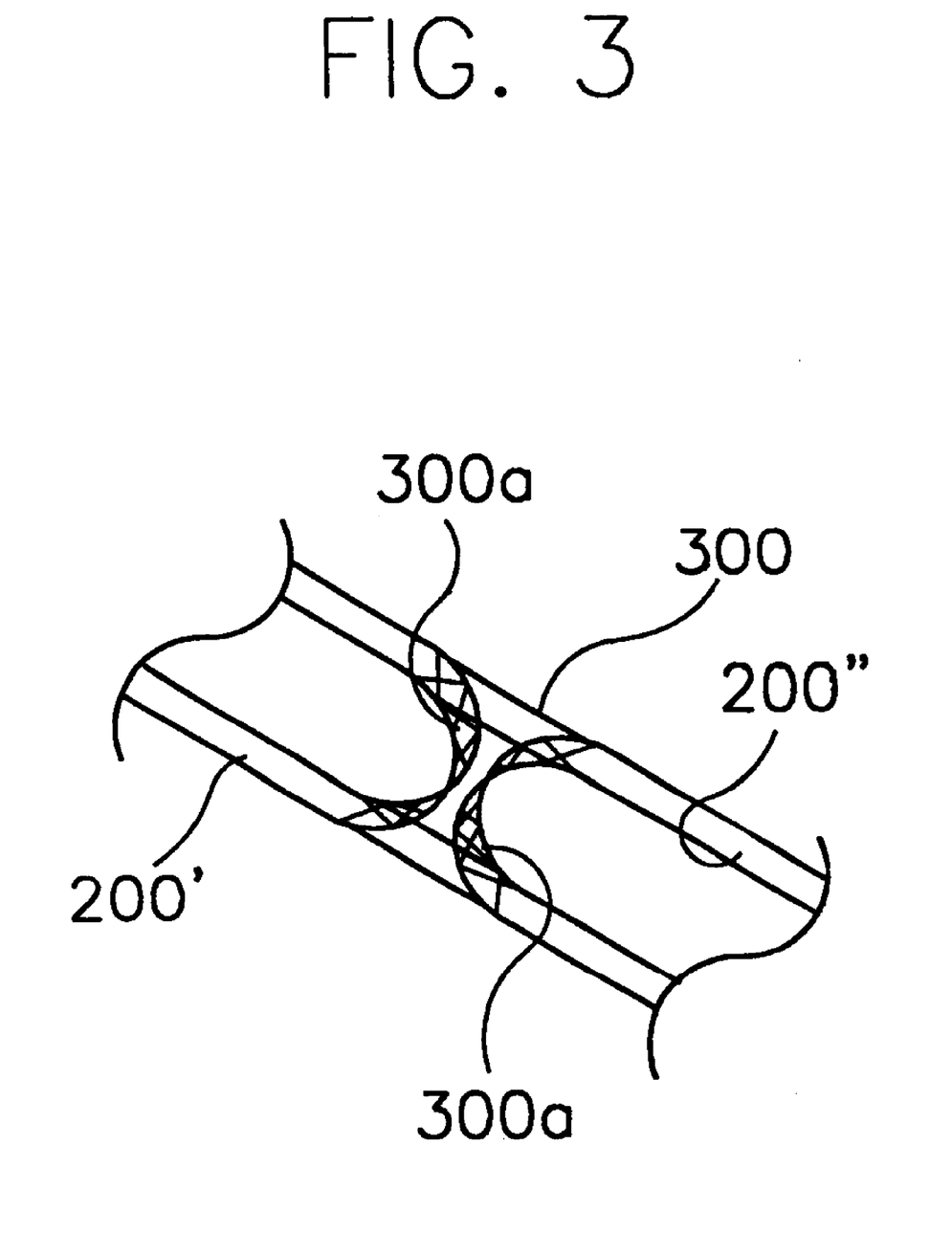
FIG. 3 is a perspective view of a return of the conveying apparatus, showing a cross rail section thereof.

FIG. 3 shows a return 300 of the conveying rail section 200. Referring to FIG. 3, the first circulation rail section 200' and the second circulation rail section 200☐ are connected to each other. Cross rail sections 300a each connect the first rail section 200' to the second rail section 200".

The vehicle section 210 of the conveying apparatus 20 comprises a plurality of over-head vehicles running along the first rail 200a and the second rail 200b independently of each other. The vehicles will be described in more detail referring to FIGS. 4 and 5.

Figure 4:
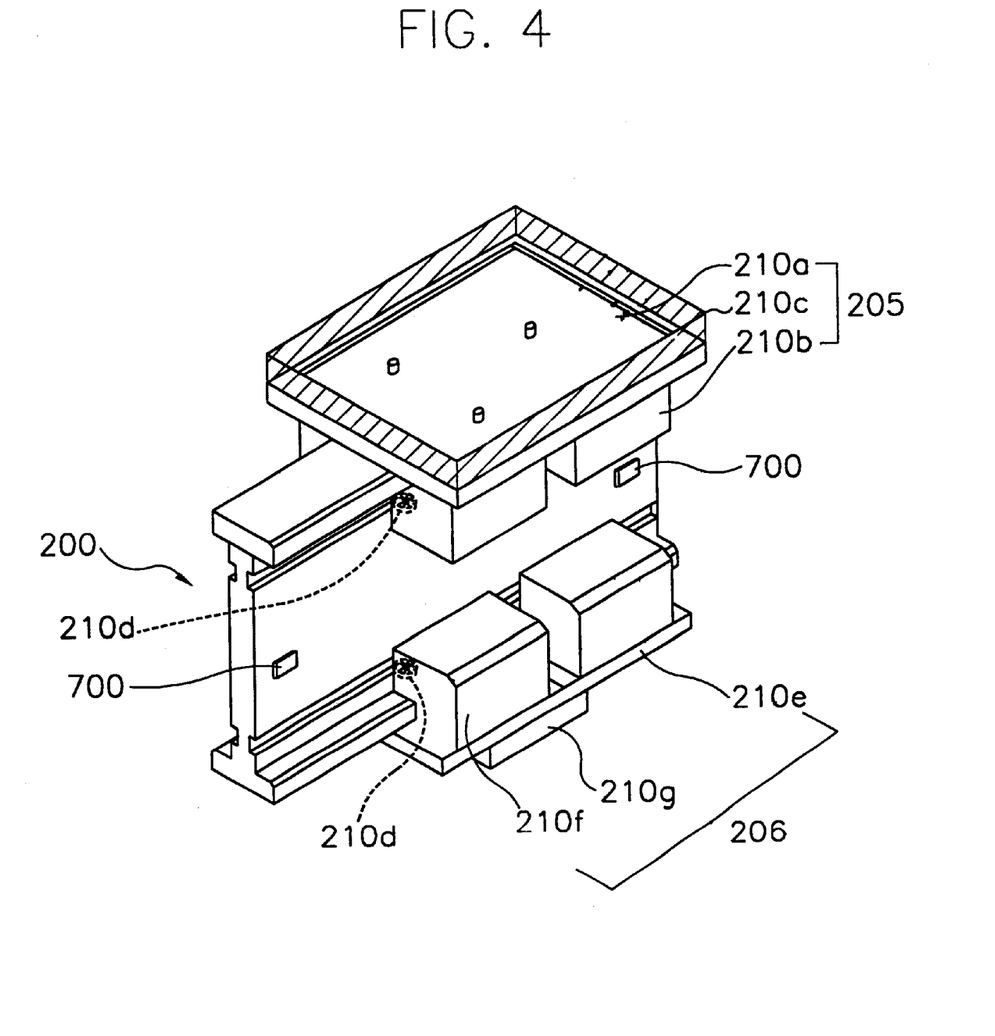
FIGS. 4 and 5 are respective perspective views of the conveying apparatus shown in FIG. 1.
Figure 5:
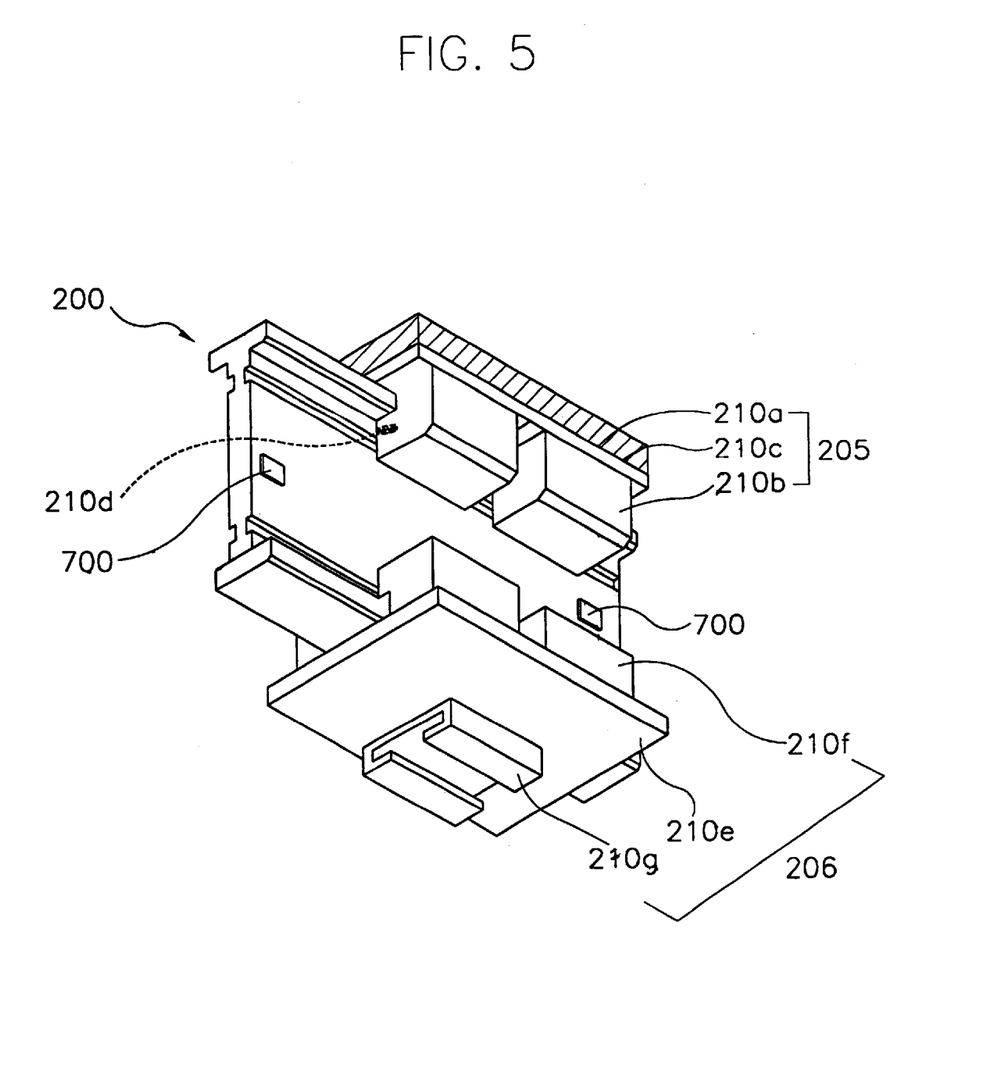

The vehicle section 210 includes at least one over-head shuttle (first) vehicle 205 and at least one over-head hoist (second) vehicle 206. The first vehicle 205 is installed on the first rail 200a and runs along the first rail 200a while supporting articles thereon.

Referring to FIG. 4, the first vehicle 205 includes a first loading portion 210a disposed over the upper surface of first rail 200a for transferring articles along the first conveying path as supported by the first rail 200a of the conveying rail section 200. The first loading portion 210a includes a plate for supporting the articles thereon and a wall 210c projecting upright along the periphery of the plate for preventing the articles from falling off of the plate while the first vehicle 210 is running along the first rail 200a. The first vehicle 205 also includes a first running portion 210b which extends from both sides of the bottom of the first loading portion 210a to both sides of the bottom surface of the first rail 200a. The first running portion 210b is also in surface-contact with the vertical beam 200c that is connected to the first rail 200a. Specifically, the first running portion 210b includes a driving mechanism 210d, comprising a wheel, for driving the first vehicle 205 along the first rail 200a.

The second vehicle 206 is installed on the second rail 200b. The second vehicle 206 runs along the second rail 200b while articles to be conveyed are suspended therefrom. The structure of the second vehicle 206 is as follows.

Referring to FIG. 5, the second vehicle 206 includes a second loading portion 210e configured to support the suspended articles. The second loading portion 210e is provided with a central flange 210g configured to hang the articles to be conveyed. in particular, the flange 210g is connected to a T-shaped connection member provided at the top of a front opening unified pod in which the articles (wafers) are loaded. The second vehicle 206 also includes a second running portion 210f that extends from both sides of the top of second loading portion 210e to both sides of the upper surface of second rail 200b. The second running portion 210f is in surface-contact with the vertical beam 200c that is connected to the second rail 200b. Specifically, the second running portion 210f includes a driving mechanism 210d, comprising a wheel, for driving the second vehicle 206 along the second rail 200b.

The conveying rail section 200 of the conveying apparatus 20 is also provided with sensors 700. The sensors 700 detect the presence of the vehicles 205, 206 running along the conveying rail section 200. Accordingly, the user can check the running state of the vehicles 205, 206 at any time.

As can be readily appreciated from the description above, the conveying apparatus 20 is an over-head transfer apparatus. In more detail, the first rail 200a and the first vehicle 205 constitute an over-head shuttle type of conveying apparatus and the second rail 200b and the second vehicle 206 constitute an over-head hoist type of conveying apparatus. In the conveying apparatus 20 of the present invention, the over-head shuttle type of conveying apparatus and the overhead hoist type of conveying apparatus are integrated.

Therefore, the overhead shuttle type of conveying apparatus and the over-head hoist type of conveying apparatus are not separately installed in the bay 1. In addition, the conveying routes for conveying the articles are not duplicated because the conveying apparatus 20 conveys the articles using the first rail 200a and the first vehicle 205 and/or using the second rail 200b and the second vehicle 206.

Accordingly, the conveying apparatus 20 can convey the articles in various manners on a single rail system, whereby the conveying routes and the space occupied by the conveying apparatus 20 are short and compact. Such a conveying apparatus 20 can be easily installed in the bay 1 to provide an automatic manufacturing system for processing wafers having a diameter of 300 mm.

Figure 6:
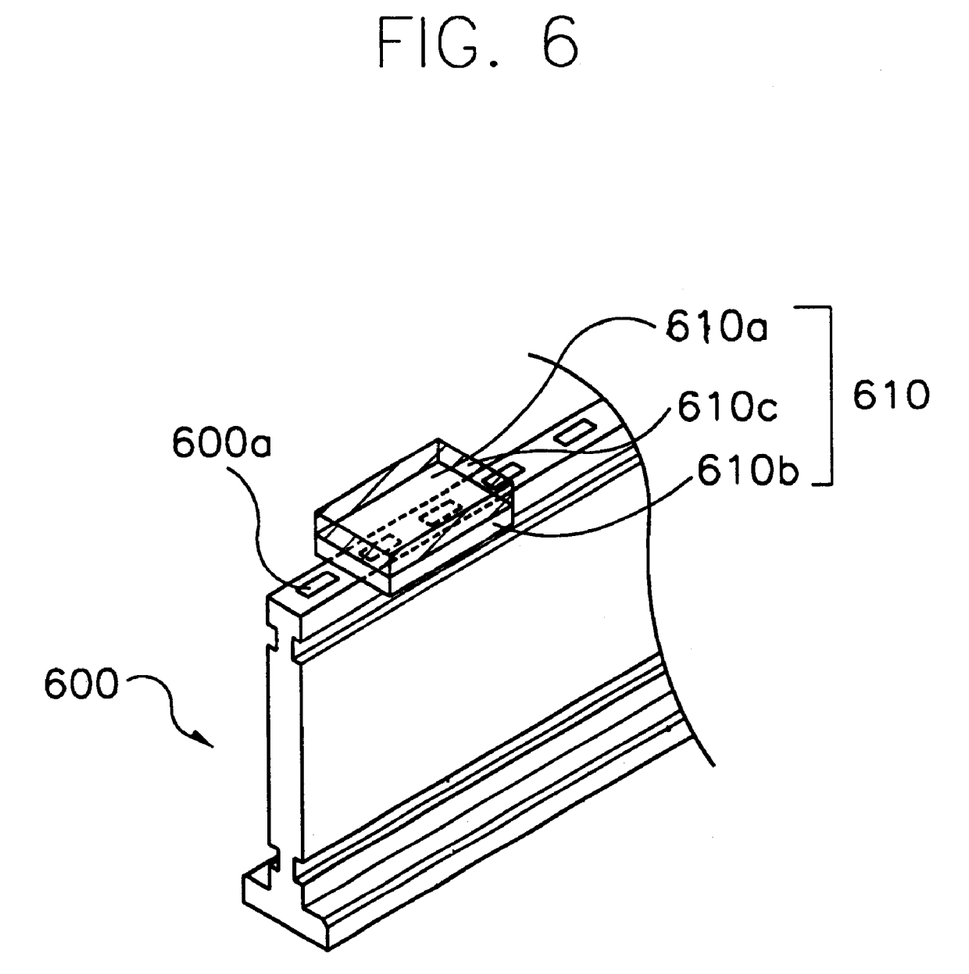
FIG. 6 is a perspective view of a second embodiment of the conveying apparatus according to the present invention.

A second embodiment of the present invention will now be described with reference to FIG. 6. In this embodiment, part of the conveying apparatus 20 can be operated by a magnetic levitating force to limit the particles produced by abrasion during operation of the conveying apparatus 20. The structure of the conveying apparatus 20 is as follows.

The conveying apparatus includes a conveying rail section 600 and a vehicle section 601 running along the conveying rail section 600.

The conveying rail section 600 includes a first rail and a second rail. The first and second rails are connected to each other, and therefore are integrated, by an intermediate rail structure such as a vertically oriented beam.

Magnets 600a are disposed at the top of the conveying rail section 600 in line with each other for generating a levitating magnetic force. In this case, the magnets 600a are installed in a line extending parallel to the ground. The second rail is disposed at the bottom of the conveying rail section 600 and extends parallel to the first rail.

The vehicle section 610 includes a third vehicle that runs along the first rail. The third vehicle is driven along the first rail by the magnetic levitating force while conveying the upwardly facing articles. The third vehicle includes a third loading portion 610a for supporting the articles. The third loading portion 610a includes a plate on which the conveyed articles rest and a wall that extends upwardly from the periphery of the plate in order to prevent the articles from falling off of the plate when the articles are conveyed. The third vehicle includes a third running portion 610b which runs along the first rail under the magnetic levitating force.

Note, the first rail may be used for guiding the first or third vehicles, whereas, the second rail is used for guiding the second vehicle. However, the second rail may be provided with magnets. In this case, the vehicle running along the second rail can be of the third type, i.e., a mag-lev vehicle that is operated by a magnetic force.

The process for conveying the articles, namely reticles and wafers, throughout the bay will now be described in more detail. First, the process of conveying articles from the interbay to the intrabay through the stocker will be described.

The articles are conveyed into the interbay 10. Then, the articles are conveyed into the stockers 120 by means of the conveying apparatus 20 installed in the interbay 10. More specifically, articles are loaded on the first vehicle 205 and are hung on the second vehicle 206, respectively, of the conveying apparatus 20 installed in the interbay 10. The conveying efficiency is high because the articles are simultaneously loaded on the first and second vehicles 205, 206. The first and second vehicles 205, 206 run along the first rail and the second rail 200a and 200b, respectively, until they reach the predetermined stockers 120. Then, the articles loaded on the first vehicle 205 are transferred to a stocker 120 by means of a conveying member of the stocker and articles suspended from the second vehicle 206 are transferred to a stocker 120 by means of a conveying member of the stocker.

The articles transferred to the stockers are conveyed into the steppers 100 installed in the intrabay 12.

That is, the articles in a stocker 120 are respectively loaded on the first vehicle 205 and hung on the second vehicle 206 of the conveying apparatus 20, installed in the intrabay 12, by means of the conveying member of the stocker. Then, the first vehicle 205 runs along the first rail 200a and the second vehicle 206 runs along the second rail 200b in the intrabay until the vehicles 205, 206 reach the predetermined steppers 100. Then, the articles loaded on the first vehicle 205 are transferred into the stepper 100 by means of a conveying member provided at the front of the stepper 100, and the articles suspended from the second vehicle 206 are transferred into the stepper 100 by means of the conveying member provided at the front of the stepper 100.

In addition, some of the articles in the stockers 120 are conveyed to the steppers 100 by the auto guide vehicle 110 which runs in the intrabay 12.

The process of conveying articles from the intrabay 12 to the stockers 120 is, of course, substantially the same as that process described above but carried out in reverse. Therefore, a detailed description of the process will be omitted for the sake of brevity.

Next, the articles conveyed into the stockers 120 are conveyed into another intrabay 12 or are conveyed out of the interbay 10 by means of the conveying apparatus 20 installed in the interbay 10.

Again, the articles in the stocker 120 are respectively loaded on the first vehicle 205 and are hung on the second vehicle 206 by means of the conveying member of the stocker 120. Then, the first vehicle 205 runs along the first rail 200a in the interbay 10 and the second vehicle 206 runs along the second rail 200b installed in the interbay 10. Accordingly, the articles can be conveyed into another intrabay 12 or out of the interbay 10.

Besides the first and second vehicles 205, 206, the third vehicle 610 operated by the magnetic levitating force can be used for conveying the articles.

As described above, the conveying apparatus according to the present invention can be adapted for use in an automatic manufacturing system laid out in a bay. In particular, the conveying apparatus of the present invention is well-suited for use in an automatic manufacturing system for processing wafers having a diameter of 300 mm.

In addition, the conveying route along which the articles are conveyed in entirely different manners is unified, the space required for laying out the manufacturing system in the bay is comparatively small, and the space in the bay can be effectively used.

Although the present invention have been described in connection with the preferred embodiments thereof, it will be understood by those skilled in the art that the present invention is not limited to the preferred embodiments. Rather, various changes and modifications can be made thereto within the spirit and scope of the invention as defined by the appended claims.

What is claimed is:

1. An automatic manufacturing system for manufacturing semiconductor devices, said system comprising:
    a bay including a plurality of intrabays disposed side-by-side, and an interbay extending between said intrabays;
    a plurality of semiconductor manufacturing apparatus disposed in each of said intrabays; and
    at least one over-head conveying apparatus disposed in said bay, said conveying apparatus comprising a conveying rail section and a vehicle section, said conveying rail section including an upwardly facing first rail extending along a first conveying route, a downwardly facing second rail extending parallel to said first rail along a second conveying route, and an intermediate rail structure interconnecting faces of said first and said second rails so as to integrate said first and second rails, and said vehicle section including at least one over-head shuttle vehicle disposed on and guided by said first rail so as to transfer articles along said first conveying route as supported by said first rail of the conveying rail section, and at least one over-head hoist vehicle disposed beneath and guided by said second rail so as to transfer articles along said second conveying route as suspended from said second rail of the conveying rail section, each said over-head shuttle and over-head hoist vehicle having an independent driving mechanism such that the articles can be conveyed independently from one another along said first and second conveying routes.

2. The automatic manufacturing system as claimed in claim 1, wherein a said over-head conveying apparatus extends in the interbay alongside ends of each of said intrabays.

3. The automatic manufacturing system as claimed in claim 2, wherein the conveying rail section has a first rail section, a second rail section adjacent to the first rail section, and cross rails connecting ends of said first and second rail sections such that said first and second vehicles can circulate along said first and second rails, respectively, in a continuous loop.

4. The automatic manufacturing system as claimed in claim 1, wherein a said over-head conveying apparatus extends alongside the semiconductor manufacturing apparatuses disposed in one of said bays.

5. The automatic manufacturing system as claimed in claim 4, wherein a said over-head conveying apparatus also extends in the interbay alongside ends of each of said intrabays.

6. The automatic manufacturing system as claimed in claim 4, wherein the conveying rail section has a first rail section, a second rail section adjacent to the first rail section, and cross rails connecting ends of said first and second rail sections such that said first and second vehicles can circulate along said first and second rails, respectively, in a continuous loop.

7. The automatic manufacturing system as claimed in claim 4, wherein a said over-head conveying apparatus also extends in the interbay alongside ends of each of said intrabays.

8. The automatic manufacturing system as claimed in claim 7, wherein the conveying rail section of the over-head conveying apparatus extending in the interbay has a first rail section, a second rail section adjacent to the first rail section, and cross rails connecting ends of said first and second rail sections such that said first and second vehicles can circulate along the first and second rails, respectively, in a continuous loop.

* * * * *